United States Patent
Wang et al.

(10) Patent No.: US 10,353,511 B2
(45) Date of Patent: Jul. 16, 2019

(54) CAPACITANCE-TO-VOLTAGE MODULATION CIRCUIT

(71) Applicant: QUALCOMM Incorporated, San Diego, CA (US)

(72) Inventors: Bo-Ren Wang, San Diego, CA (US); Lennart Mathe, San Diego, CA (US); Sameer Wadhwa, San Diego, CA (US); Nathan Altman, San Diego, CA (US); Sandeep D'Souza, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 99 days.

(21) Appl. No.: 15/271,131

(22) Filed: Sep. 20, 2016

(65) Prior Publication Data

US 2018/0052558 A1    Feb. 22, 2018

Related U.S. Application Data

(60) Provisional application No. 62/377,373, filed on Aug. 19, 2016.

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06K 9/0002* (2013.01);
(Continued)

(58) Field of Classification Search
CPC ...... G06F 3/0416; G06F 3/044; G06K 9/0002
See application file for complete search history.

(56) References Cited

U.S. PATENT DOCUMENTS

| 5,793,230 A * | 8/1998 | Chu ....................... H03K 5/007 327/307 |
| 8,471,827 B2 * | 6/2013 | Lee ......................... G06F 3/044 345/173 |

(Continued)

FOREIGN PATENT DOCUMENTS

| EP | 2014227 | 1/2009 |
| WO | 2016007725 | 1/2016 |
| WO | 2016061429 | 4/2016 |

OTHER PUBLICATIONS

Shiah J., et al., "A 5-V 290-μW Low-Noise Chopper-Stabilized Capacitive-Sensor Readout Circuit in 0.8-μm CMOS Using a Correlated-Level-Shifting Technique," IEEE Transactions on Circuits and Systems—II: Express Briefs, Apr. 2014, vol. 61 (4), pp. 254-258.

(Continued)

*Primary Examiner* — Peter D McLoone
(74) *Attorney, Agent, or Firm* — Colby Nipper/Qualcomm

(57) ABSTRACT

The present disclosure describes aspects of a capacitance-to-voltage modulation circuit. In some aspects, the circuit is used in touch sensing. In some aspects, a modulation circuit comprises a first pair of switches having one switch connected between a voltage source and a capacitor, and another switch connected between ground and the input of the circuit. The circuit also includes a second pair of switches having one switch connected between the voltage source and the input of the circuit, and another switch connected between ground and the capacitor. A third pair of the circuit's switches comprise one switch connected between the capacitor and an input of an analog-to-digital converter (ADC) and another switch connected between the input of the circuit and the input of the ADC. The third pair of switches may enable charge sharing of signals modulated by the first and second pairs of switches, a result of which can (Continued)

be used to sense touch input based on capacitance at the input of the circuit.

30 Claims, 11 Drawing Sheets

(51) Int. Cl.
G06K 9/00 (2006.01)
H03K 17/955 (2006.01)
H03K 17/96 (2006.01)

(52) U.S. Cl.
CPC ......... *H03K 17/955* (2013.01); *H03K 17/962* (2013.01); *H03K 2217/96074* (2013.01); *H03K 2217/960725* (2013.01); *H03K 2217/960745* (2013.01)

(56) References Cited

U.S. PATENT DOCUMENTS

| | | | | |
|---|---|---|---|---|
| 8,525,810 B2* | 9/2013 | Kobayashi | ............... | G06F 3/044 178/18.01 |
| 8,525,811 B2* | 9/2013 | Lee | ............... | G06F 3/044 345/174 |
| 8,564,313 B1* | 10/2013 | Ryshtun | ............... | H03K 17/962 324/678 |
| 8,570,053 B1* | 10/2013 | Ryshtun | ............... | H03K 17/962 324/678 |
| 8,593,429 B2* | 11/2013 | Wang | ............... | H03K 17/9622 345/174 |
| 8,779,783 B1* | 7/2014 | Liepold | ............... | G06F 3/016 324/658 |
| 8,854,064 B2 | 10/2014 | Aras et al. | | |
| 8,988,390 B1* | 3/2015 | Krah | ............... | G06F 3/0416 345/174 |
| 9,007,310 B1* | 4/2015 | Olson | ............... | G06F 3/044 345/173 |
| 9,013,447 B2 | 4/2015 | Kim | | |
| 9,128,573 B2 | 9/2015 | Angelini et al. | | |
| 9,279,841 B2 | 3/2016 | Tseng et al. | | |
| 9,310,924 B2* | 4/2016 | Hanssen | ............... | H03K 17/9622 |
| 9,442,144 B1* | 9/2016 | Ryshtun | ............... | H03K 17/962 |
| 9,484,944 B2* | 11/2016 | Peluso | ............... | G01R 19/16566 |
| 9,639,226 B2* | 5/2017 | Gradinariu | ............... | G06F 3/044 |
| 9,671,916 B2* | 6/2017 | Hanssen | ............... | G06F 3/044 |
| 9,806,608 B2* | 10/2017 | Yao | ............... | H02M 3/07 |
| 2005/0001633 A1* | 1/2005 | Okushima | ............... | H03K 17/962 324/658 |
| 2005/0099188 A1* | 5/2005 | Baxter | ............... | G01D 5/24 324/678 |
| 2007/0046299 A1* | 3/2007 | Hargreaves | ............... | G01R 27/2605 324/678 |
| 2009/0167718 A1* | 7/2009 | Lee | ............... | G06F 3/0416 345/174 |
| 2010/0171723 A1* | 7/2010 | Kobayashi | ............... | G06F 3/0416 345/174 |
| 2011/0122089 A1* | 5/2011 | Kobayashi | ............... | G06F 3/0418 345/174 |
| 2011/0163993 A1* | 7/2011 | Lee | ............... | G06F 3/044 345/174 |
| 2014/0085252 A1 | 3/2014 | Hanssen et al. | | |
| 2015/0048851 A1 | 2/2015 | Erdogan et al. | | |
| 2016/0013804 A1* | 1/2016 | Peluso | ............... | G01R 19/16566 341/164 |
| 2016/0224160 A1* | 8/2016 | Hanssen | ............... | H03K 17/9622 |
| 2016/0241139 A1* | 8/2016 | Yao | ............... | G06F 1/3262 |
| 2016/0378227 A1* | 12/2016 | Ryshtun | ............... | H03K 17/962 345/174 |
| 2017/0315650 A1* | 11/2017 | Reynolds | ............... | G06F 3/0414 |
| 2017/0336893 A1* | 11/2017 | Hanssen | ............... | H03K 17/9622 |
| 2018/0062508 A1* | 3/2018 | Yao | ............... | G06F 1/3262 |

OTHER PUBLICATIONS

"International Search Report and Written Opinion", PCT Application No. PCT/US2017/044710, dated Nov. 8, 2017, 17 pages.

Seraji, et al., "On the Design and Optimization of a Switched-Capacitor Interface Circuit for MEMS Capacitive Sensors", 20th Iranian Conference on Electrical Engineering, (ICEE2012), Tehran, Iran, May 15-17, 2012, 5 pages.

Wang, et al., "A Power-Efficient Capacitive Read-Out Circuit With Parasitic-Cancellation for MEMS Cochlea Sensors" IEEE Transactions on Biomedical Circuits and Systems, 2015, 13 pages.

* cited by examiner

CAPACITANCE-TO-VOLTAGE MODULATION CIRCUIT

PRIORITY APPLICATION

This application claims priority under 35 U.S.C. § 119(e) to U.S. Provisional Patent Application Ser. No. 62/377,373, titled "Capacitance-To-Voltage Modulation Circuit", filed on Aug. 19, 2016, the disclosure of which is incorporated by reference herein in its entirety.

BACKGROUND

Field of the Disclosure

This disclosure relates generally to capacitive sensors.

Description of Related Art

This description of related art is provided for the purpose of generally presenting a context for the disclosure that follows. Unless indicated otherwise herein, concepts described in this section are not prior art to this disclosure and are not admitted to be prior art by inclusion herein.

Many computing and electronic devices implement capacitive sensors to detect various inputs, for example types of user input. To do so, capacitive sensors often comprise a sensing capacitor, a capacitance of which increases in response to the presence of a user's finger. Relative to the inherent or self-capacitance (e.g., 200 pF) of the sensing capacitor, however, the increase of capacitance caused by the user's finger is typically very small (e.g., 1 pF). Thus, in order to reliably detect the presence of the user's finger, circuitry associated with the sensor may be configured to be able to detect a small change in capacitance relative the much higher self-capacitance of the sensing capacitor or surrounding structure of the sensor. Detecting these small changes in capacitance is further complicated by electrical background noise carried by the user and voltage offsets inherent in sensing circuitry, such as input offset voltage, temperature drift (capacitive or resistive), pink (1/f) noise, or other spurious electrical noise that interferes with the sensing circuitry and signals thereof.

SUMMARY

In some aspects of a capacitance-to-voltage modulation circuit, a modulation circuit comprises a first pair of switches that includes one switch connected between a voltage source and a capacitor, and another switch connected between ground and an input of the circuit. The circuit also includes a second pair of switches having one switch connected between the voltage source and the input of the circuit, and another switch connected between ground and the capacitor. A third pair of the circuit's switches comprise one switch connected between the capacitor and an input of an analog-to-digital converter (ADC) and another switch connected between the input of the circuit and the input of the ADC.

In other aspects, a modulation circuit comprises a first pair of switches that includes one switch connected between a voltage source and a capacitor, and another switch connected between ground and an input of the circuit. The circuit also includes a second pair of switches having one switch connected between the voltage source and the input of the circuit, and another switch connected between ground and the capacitor. A third pair of the circuit's switches comprise one switch connected between the capacitor and an input of an amplifier, and another switch connected between the input of the circuit and the input of the amplifier.

In yet other aspects, an apparatus for scanning fingerprints comprises a fingerprint scanner, a sensing capacitor, and a touch sense circuit having an input connected to an electrode the sensing capacitor and an output connected to the fingerprint scanner. The touch sense circuit comprises a first switch connected between a voltage source and a capacitor, a second switch connected between ground and the input of the circuit, a third switch connected between the voltage source and the input of the circuit, and a fourth switch connected between ground and the capacitor. The circuit also includes a fifth switch connected between the capacitor and the input of the circuit. An ADC of the circuit has an input connected to the capacitor and an output connected to an input of a demodulator. An output of the demodulator is connected to an input of a comparator, an output of which is connected to the fingerprint scanner.

In other aspects, a circuit for modulating an indication of capacitance at an input of the circuit comprises first switching means for connecting a voltage source to a capacitor, and the input of the circuit to ground. The circuit also includes second switching means for connecting the voltage source to the input of the circuit, and the capacitor to ground. Third switching means of the circuit are implemented for connecting the capacitor to an input of an analog-to-digital converter (ADC), and the input of the circuit to the input of the ADC.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Figure 1:
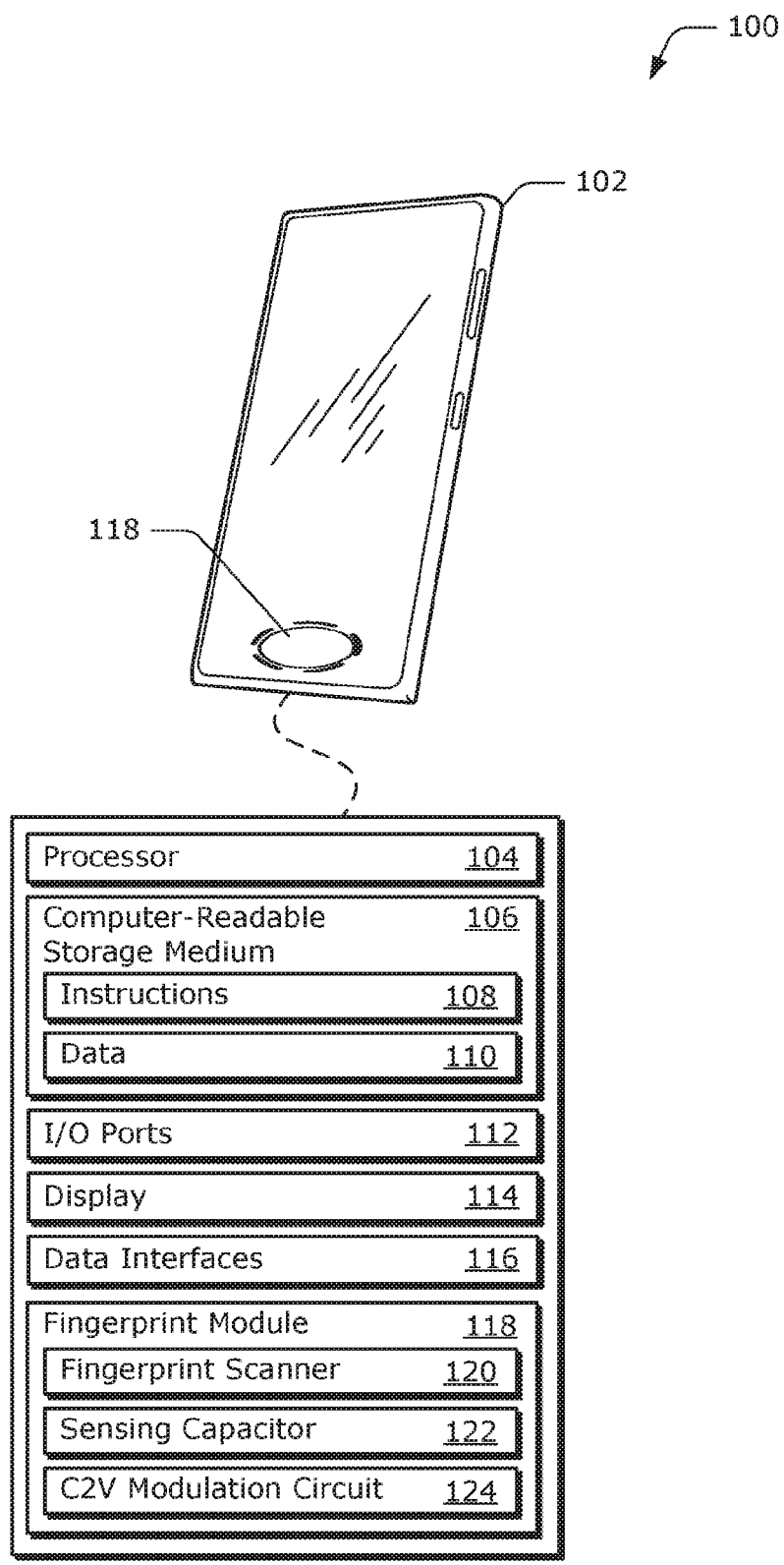
FIG. 1 illustrates an example environment that includes a touch-enabled computing device.

Many computing and electronic devices implement capacitive sensors to detect various inputs, for example types of user input. To do so, capacitive sensors often comprise a sensing capacitor, a capacitance of which increases in response to proximity of a user's finger. Relative to the inherent or self-capacitance of the sensing capacitor or surrounding structure, however, the increase of capacitance caused by the user's finger is typically very small. For example, fingerprint scanning modules often include a capacitive sensor to detect the presence of the user's finger to initiate scanning operations. This permits the fingerprint scanner to remain in a low-power state until a user's finger is detected, thereby conserving power. Fingerprint scanning modules, however, often reside under or include a layer of substrate that protects the fingerprint scanner and provides a surface by which to scan the user's fingerprint. This layer of substrate, such as glass, epoxy, or polyimide, may be several hundred microns thick and contribute to the self-capacitance of the capacitive sensor.

As such, in order to reliably detect the presence of the user's finger, circuitry associated with the sensor may be configured to detect a small change in capacitance relative to the much higher self-capacitance of the sensor or surrounding structure of the device. Detecting these small changes in capacitance is further complicated by electrical background noise carried by the user and voltage offsets inherent in electrical circuitry, such as input offset voltage, temperature drift (capacitive or resistive), pink (1/f) noise, or other spurious electrical noise (e.g., charging noise) that interferes with the detection circuitry and signals thereof.

Conventional techniques for reducing noise and offset of touch input signals include the use of redundant sense capacitors, differential sensing paths, or a sinusoidal excitation voltage. To do so, these techniques may require additional circuitry, access to different electrodes of the sensing capacitors, or complex digital-to-analog circuitry for sinusoidal excitation, each of which increases complexity or power consumption of the touch sense circuits. Accordingly, the conventional techniques increase complexity and power consumption of a sense circuit, yet fail to address many of the afore-mentioned issues of sensing accuracy, such as serial resistance variation and sensing capacitor variation over temperature or frequency.

This disclosure describes aspects of a capacitance-to-voltage (C2V) modulation circuit, for example for sensing touch input. Apparatuses and methods described herein may enable modulation of an input capacitance signal prior to amplification and with reference to a replica capacitor, which may provide an indication of the input capacitance that is robust to drift offset (temperature or frequency), resistant to common mode noise, and unaffected by or resistant to changes of a reference voltage.

In some aspects of capacitance-to-voltage modulation circuits, a circuit comprises a first pair of switches that includes a switch connected between a voltage source and a capacitor, and another switch connected between ground and an input of the circuit. The circuit also includes a second pair of switches having a switch connected between the voltage source and the input of the circuit, and another switch connected between ground and the capacitor. A third pair of the circuit's switches comprise a switch connected between the capacitor and an input of an analog-to-digital converter (ADC), and another switch connected between the input of the circuit and the input of the ADC.

The first and second pairs of switches may operate on alternate periods of a clock to generate a square wave by which the input of the circuit, and a sense capacitor connected thereto, is modulated into a voltage signal. An internal or "replica" capacitor of the circuit may be modulated with an inverse of the square wave, such that the internal capacitor is charged (or discharged) in opposition to the sense capacitor. The third pair of switches charge share the respective voltage signals of the capacitor and input, which is sampled by the ADC with reference to the voltage source. The ADC and subsequent digital signal operations can remove offset associated with the voltage source, demodulate the signal to near-DC, and filter out high-frequency noise to provide a signal that more-accurately reflects touch input received at the sense capacitor.

These and other aspects of a capacitance-to-voltage modulation circuit are described below in the context of an example environment, example modulation circuits, and techniques. Any reference made with respect to the example environment or circuit, or elements thereof, is by way of example only and is not intended to limit any of the aspects described herein.

Example Environment

FIG. 1 illustrates an example environment 100, which includes a computing device 102. In this example, the computing device 102 is implemented as a touch-enabled smart-phone. Although not shown, the computing device 102 may be implemented as any suitable computing or electronic device, such as a modem, cellular base station, broadband router, access point, cellular phone, gaming device, navigation device, media device, laptop computer, desktop computer, server, network-attached storage (NAS) device, smart appliance, vehicle-based communication system, and the like.

The computing device 102 includes a processor 104 and computer-readable storage medium 106 (CRM 106). The processor 104 may include any type of processor, such as an application processor or multi-core processor, configured to execute processor-executable code stored by the computer-readable storage medium 106. The CRM 106 may include any suitable type of data storage media, such as volatile memory (e.g., random access memory (RAM)), non-volatile memory (e.g., Flash memory), optical media, magnetic media (e.g., disk or tape), and the like. In the context of this disclosure, the CRM 106 is implemented to store instructions 108, data 110, and other information of the computing device 102, and thus does not include transitory propagating signals or carrier waves.

The computing device 102 also includes input/output ports 112 (I/O ports 112), a display 114, and data interfaces 116. The I/O ports 112 enable data exchanges or interaction with other devices, networks, or users. The I/O ports 112 may include serial ports (e.g., universal serial bus (USB) ports), parallel ports, audio ports, infrared (IR) ports, and the like. The display 114 presents graphics of the computing device 102, such as a user interface associated with an operating system, program, or application.

The data interfaces 116 provides connectivity to respective networks and other electronic devices connected therewith. The data interfaces 116 may comprise wired data interfaces, wireless data interfaces, or any suitable combination thereof. Example wired data interfaces of the computing device 102 include Ethernet or fiber optic interfaces for communicating over a local network, intranet, or the Internet. Alternately or additionally, the wireless interfaces may include a modem or radio configured to communicate over a wireless network, such as a wireless LAN, peer-to-peer (P2P), cellular network, and/or wireless personal-area-network (WPAN).

The computing device 102 also includes a fingerprint module 118, which is a biometric sensor module that may enable identification or authentication of users. Fingerprint module 118 includes a fingerprint scanner 120, sensing capacitor 122, and capacitance-to-voltage modulation circuit 124 (C2V modulation circuit 124). The fingerprint scanner 120 detects (e.g, by imaging) ridges and valleys of a user's finger to provide digital data which may be used for identification and authentication operations implemented by security applications of the computing device 102. The fingerprint scanner 120 may comprise any suitable type of fingerprint scanner, such as an optical, capacitive, or ultrasonic fingerprint scanner. Alternately or additionally, the fingerprint scanner 120 may be embedded within the computing device 102, such as beneath a touch screen of the display 114 or other exterior surface of the device (e.g., metal, plastic, ceramic, or composite housing).

In some aspects, the sensing capacitor 122 and C2V modulation circuit 124 enable the fingerprint module 118 to determine a presence of a user's finger. By so doing, the fingerprint scanner 120, which consumes more energy than the C2V modulation circuit 124, can be left in a low-power state to conserve energy of the computing device 102. The sensing capacitor 122 may be implemented as any suitable structure having a capacitance that varies responsive to proximity or contact with a user or other object having a dielectric different from air. The C2V modulation circuit 124 is connected to the sensing capacitor 122 and provides an indication of the capacitance of the sensing capacitor 122. The implementation and use of the sensing capacitor 122 and C2V modulation circuit 124 varies, and is described below in greater detail.

Figure 2:
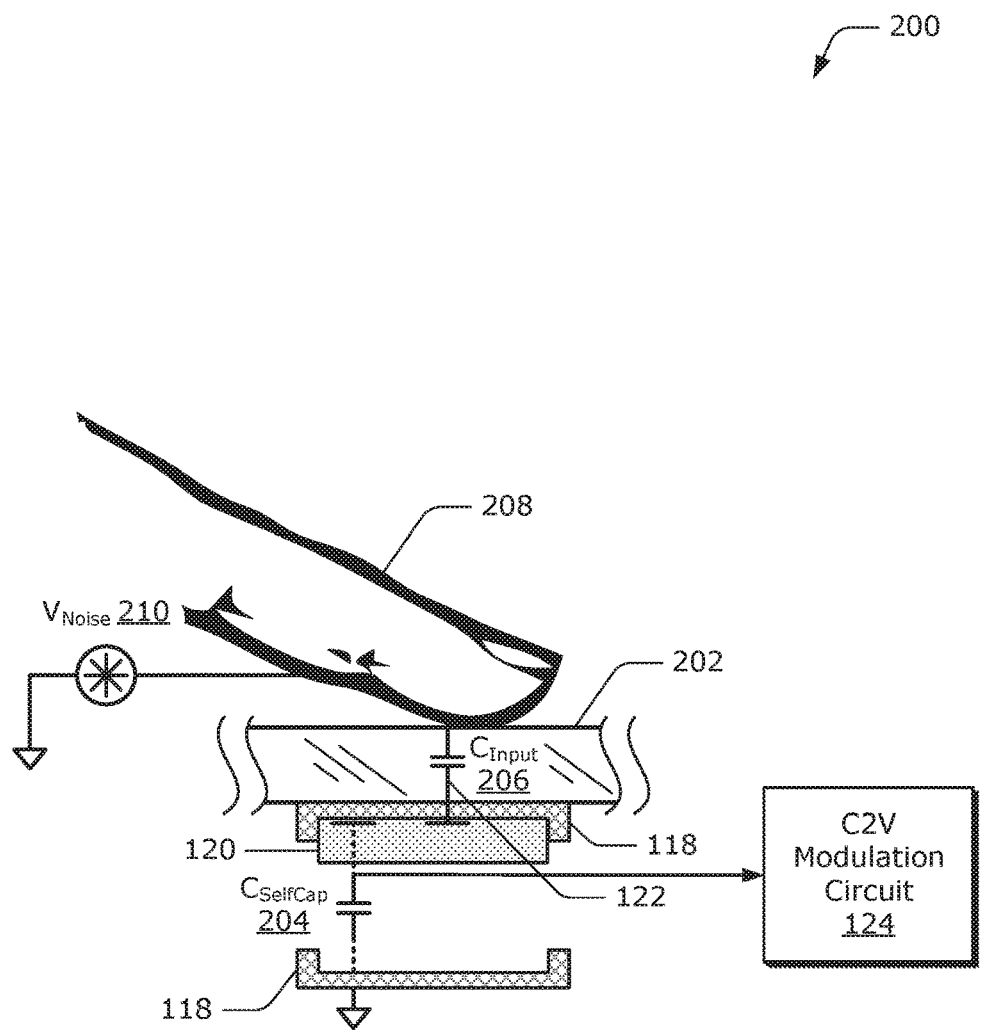
FIG. 2 illustrates an example configuration of the fingerprint sensor shown in FIG. 1.

FIG. 2 illustrates an example configuration of the fingerprint module 118 generally at 200. In this particular example, the fingerprint module 118 is positioned below a glass layer 202 of the display 114. The glass layer 202 may include other layers (not shown), such as a liquid-crystal display cell, touch screen stack (e.g., indium tin oxide), or surface coatings (e.g., hydrophobic or oleophobic). The fingerprint module 118 includes the fingerprint scanner 120 and sensing capacitor 122. Here, self-capacitance 204 of the fingerprint scanner 120 (or other structure around the sensing capacitor 122) is shown in parallel with input capacitance 206 of sensing capacitor 122. The input capacitance 206 of the sensing capacitor 122 varies with proximity or presence of an object with respect to a surface of the glass layer 202.

By way of example, assume that the computing device 102 is locked and in a low-power state (including fingerprint scanner 120), and that a user desires to unlock the device to access the computing device 102. To initiate an unlocking procedure based on user authentication via the fingerprint scanner 120, the user places his finger 208 on the surface of the glass layer 202. Here, note that the user's finger 208 also introduces background noise 210, which is received by the C2V modulation circuit 124. As such, to detect the user's initiation of the unlock procedure and activate the fingerprint scanner 120, the C2V modulation circuit measures the input capacitance 206 of the sensing capacitor 122 while compensating for the self-capacitance 204, background noise 210, and other sources of signal and measurement error. How the C2V modulation circuit 124 is implemented and used to measure input capacitance varies, and aspects of such implementation are described in greater detail below.

Example Capacitance-to-Voltage Modulation Circuits

Figure 3:
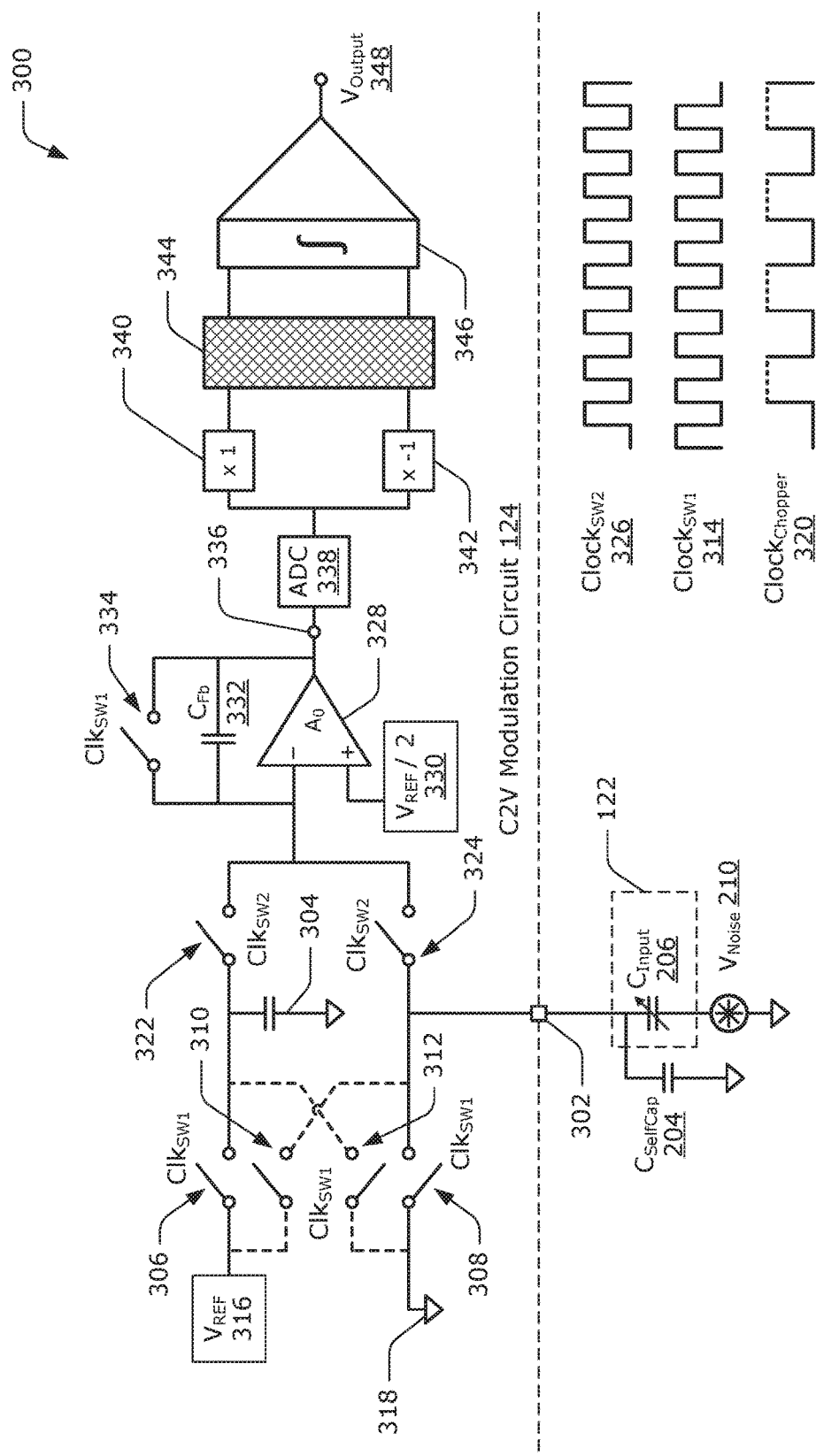
FIG. 3 illustrates an example capacitance-to-voltage modulation circuit in accordance with one or more aspects.

FIG. 3 illustrates an example capacitance-to-voltage (C2V) modulation circuit 124 for touch sensing in accordance with one or more aspects at 300. Although described with reference to components or values associated with the fingerprint module 118, aspects of this circuits can be used with any suitable capacitive element. In the following description, components of circuits may be connected (e.g., directly) or operably connected by one or more intervening components. Further, signal- or current-carrying structures of the circuits may be implemented as any suitable type of conductor, such as wires, printed-circuit board (PCB) traces, etched metal layers, contacts, nets, paths, rails, and the like. The use of these terms is not meant to limit configurations of any circuit, but to provide context for describing the circuits of the accompanying figures.

The C2V modulation circuit 124 may be implemented within a chip or on a circuit die to which an electrode of the sensing capacitor 122 connects via an input 302 (e.g., input pin, pad, or contact). As described with reference to FIG. 2, the input 302 of the C2V modulation circuit also receives the background noise 210 and is influenced by the self-capacitance 204 of the structure around the sensing capacitor 122. Note that these sources of measurement error are not static and may change over time. For example, the background noise 210 can vary based on an environment of the computing device 102 and the user. Alternately or additionally, the self-capacitance 204 can drift in response to changes in temperature or vary over different frequencies.

The C2V modulation circuit 124 includes a replica capacitor 304 of the self-capacitance 204 associated with the sensing capacitor 122. The replica capacitor 304 can be configured such that a value of the replica capacitor 304 approximates that of the self-capacitance 204 of the fingerprint scanner 120 or another structure that effects the capacitance of the sensing capacitor 122. Alternately, when the value of the replica capacitor 304 is known, a sensing capacitor or element may be selected with an approximate or matching amount of capacitance. In some cases, the value of the replica capacitor 304 is variable or adjustable. For example, the value of the replica capacitor 304 can be adjusted to match (e.g., calibrate-out) the value of self-capacitance over time and temperature.

In aspects of C2V modulation, switches of the C2V modulation circuit 124 convert respective capacitances at the input 302 and of the replica capacitor 304 to signals by applying a modulating or chopping signal to the input and the replica capacitor. In this particular example, the C2V modulation circuit 124 includes alternate modulation paths, a first path comprising first switches 306 and 308, and a second path comprising second switches 310 and 312. The switches may be implemented as any suitable type of switch element, such as n-type or p-type metal-oxide-semiconductor field-effect transistors (MOSFETs). These switches periodically charge and discharge the replica capacitor 304 and the capacitance at the input 302, which includes the sensing capacitor 122 and the self-capacitance 204.

For example, the switch 306 connects, based on a first switch clock 314 (Clock$_{SW1}$ 314), the replica capacitor 304 to a reference voltage source 316 (V$_{Ref}$ 316) to charge the replica capacitor 304. The switch 308 also connects, based on a same period of the first switch clock 314, the input 302 to ground 318 to discharge voltage at the input 302. For visual clarity, the modulation signal paths of the first switches 306 and 308 are shown as solid black lines between the switches and the capacitors. Although not shown, respective gates or drivers of the first switches 306 and 308 may be connected together. The first switches 306 and 308 are active, or close, on every other period of the first switch clock 314 as indicated during low times of a chopper clock 320 that operates at half of a frequency of the first switch clock.

During alternate periods of the first switch clock 314, as indicated by high times of the chopper clock 320, the second switches 310 and 312 are active, or close, to implement inverse modulation or chopping signals. For example, the switch 310 connects, based on the first switch clock 314, the input 302 to the reference voltage source 316 to charge the capacitance at the input pin 302. The switch 312 also connects, based on a same period of the first switch clock 314, the replica capacitor 304 to ground 318 to discharge voltage of the replica capacitor 304. For visual clarity, the modulation signal paths of the second switches are shown as dashed lines, which correspond to similarly marked high times of the chopper clock 320. Although not shown, respective gates or drivers of the second switches 310 and 312 may be connected together.

In some aspects, converting the respective capacitances at the input 302 and of the replica capacitor 304 to respective voltage signals at a frequency of the chopper clock 320 (e.g., 125 KHz) enables low frequency noise, such as pink noise and thermal noise, to be minimized or eliminated. Alternately or additionally, effects of serial resistance in the switches or signal lines can be mitigated by using a switch clock having a period long enough to account for resistor-capacitor (RC) constants and associated settling time. For example, for a circuit having a serial resistance of 500 Ohms and an input with self-capacitance of 300 pF, a settling time of one microsecond reduces a sensing error rate to 0.13%, an improvement of approximately 27 times over conventional sensing circuits (3.5% error rate).

The C2V modulation circuit 124 also includes a third set of switches 322 and 324 that enable connection of the input 302 to the replica capacitor 304. In some cases, this can be effective to charge share the respective voltages of the input 302 and replica capacitor 304. The third set of switches 322 and 324 are active, or closed, based on a second switch clock 326 ($Clock_{SW2}$ 326). Unlike the modulating switches, the switches 322 and 324 may be active on consecutive periods of the second switch clock. Although not shown, respective gates or drivers of the third switches 322 and 324 may be connected together. As shown in FIG. 3, the first switch clock 314 and second switch clock 326 are out of phase by 180 degrees, which avoids shorting out the modulation paths provided by the other switches. As such, the third set of switches 322 and 324 charge share the respective voltages of the input 302 and replica capacitor 304 when the capacitors are out of the modulation circuit.

In this particular example, an amplifier 328 of the C2V modulation circuit 124 receives a result of the charge share between the input 302 and replica capacitor 304 at an inverting input. The non-inverting input of the amplifier 328 is referenced to one half of the reference voltage 330, which enables tracking of drift in the reference voltage. The amplifier 328 is configured as an integrator with a feedback capacitor 332 ($C_{Fb}$ 332) and a reset switch 334 that resets the integration during high times of the first switch clock 314.

An output signal 336 of the amplifier is received by an analog-to-digital converter 338 (ADC 338) of the C2V modulation circuit 124, which converts the output signal 336 into a digital format for subsequent processing. The output of the ADC 338 is split between a unity gain block 340 and inverter block 342 to enable recovery of a signal having an absolute or positive value. A digital demodulation block 344 of the circuit demodulates or un-chops digital signals to recover a signal indicating the capacitance at the input 302. The demodulation block 344 can implement demodulation operations based on a clock having an approximate frequency of the first switch clock 314. In other words, the digital demodulation block 344 may be considered to implement, digitally, a mirror image of the modulation path switches to recover the signal indicating the capacitance at the input 302.

In some aspects, the C2V modulation circuit 124 includes a low-pass filter 346 to remove noise from the demodulated signal. The low-pass filter 346 may be implemented as any suitable type of low-pass filter or second-order low-pass filter, such as a Butterworth filter, Chebyshev filter, Bessel filter, Sallen-Key filter, and the like. The filtered signal is provided as an output 348 ($V_{Output}$ 348) of the C2V modulation circuit 124 to enable detection of touch input received at sensing capacitor 122.

Figure 4:
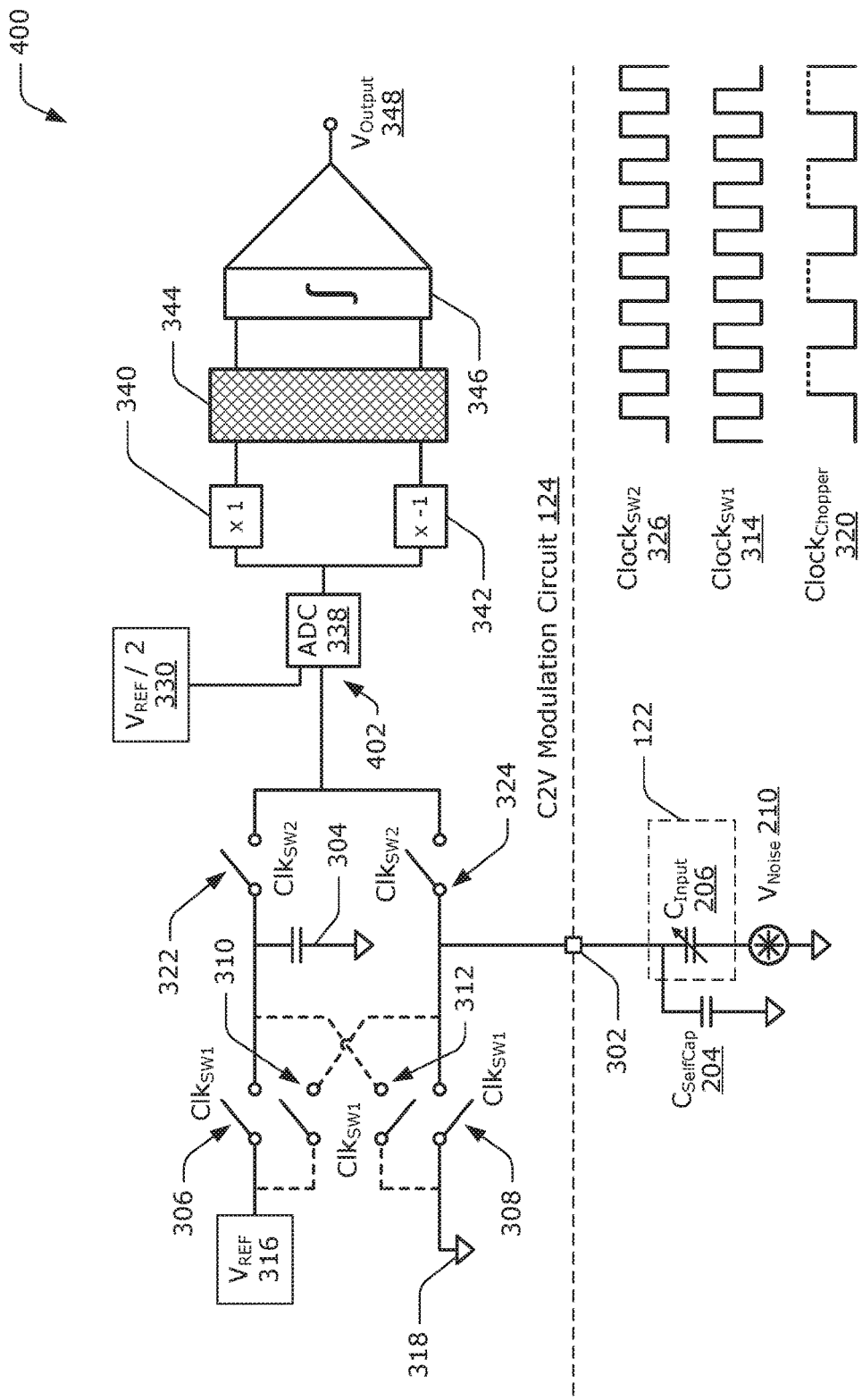
FIG. 4 illustrates another example capacitance-to-voltage modulation circuit in accordance with one or more aspects.

FIG. 4 illustrates another example of the C2V modulation circuit 124 for touch sensing in accordance with one or more aspects at 400. For brevity, a duplicate description of some elements described with reference to FIG. 3 is omitted. Notwithstanding this omission, elements of either circuit may be combined, separated, rearranged, or implemented in alternate form to provide circuits in accordance with one or more aspects of a capacitance-to-voltage modulation circuit for sensing touch.

In this particular example, the C2V modulation circuit 124 implements analog-to-digital conversion of a charge share signal provided by the switches 322 and 324. This can be effective to save power or prevent an amplifier or pre-amplifier from saturating. In some cases, half of the reference voltage 330 is also converted to a digital signal. In such cases, this enables drift in the reference voltage 316 to be compensated by the ADC 338 or other digital signal processing blocks downstream of the ADC 338.

Techniques of Capacitance-to-Voltage Modulation

The following techniques of capacitance-to-voltage modulation may be implemented using any of the previously described elements of the example environment, components, or circuits. Reference to elements, such as the sensing capacitor 122, input 302, replica capacitor 304, switches 306-312, amplifier 328, or ADC 338, is made by example only and is not intended to limit the ways in which the techniques can be implemented. In some embodiments the capacitance-to-voltage modulation is used for touch sensing.

The techniques are described with reference to example methods illustrated in FIGS. 5, 7, and 11, which are depicted as respective sets of operations or acts that may be performed by entities described herein. The depicted sets of operations illustrate a few of the many ways in which the techniques may be implemented. As such, operations of a method may be repeated, combined, separated, omitted, performed in alternate orders, performed concurrently, or used in conjunction with another method or operations thereof.

Figure 5:
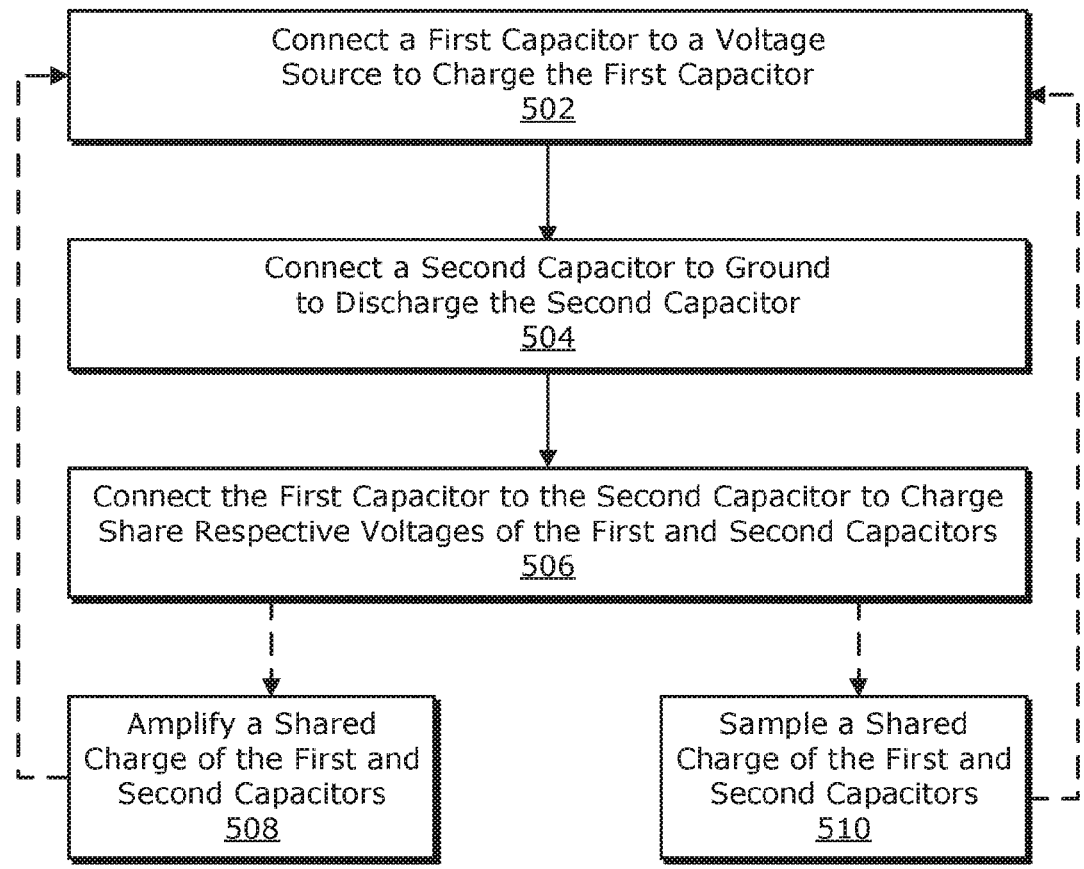
FIG. 5 illustrates an example method for modulating a signal that indicates an amount of capacitance at an input of a circuit.

FIG. 5 illustrates an example method 500 for modulating a signal that indicates an amount of capacitance at an input of a circuit. The operations described herein may be performed using any suitable circuitry or component, which may provide means for implementing one or more of the operations. In some cases, the operations are performed by an apparatus (e.g., ADC, digital-signal processor (DSP), or microcontroller) configured to modulate, demodulate, or filter signals enabling touch sensing. In such cases, instructions executed by a processor of the apparatus may cause the apparatus to perform the operations.

At 502, the method comprises connecting a first capacitor to a voltage source. The first capacitor may be a replica capacitor or a sensing capacitor connected to an input of a touch sense circuit. In some cases, the first capacitor is connected to the voltage source based on a clock. In such cases, the first capacitor can be connected to the voltage source during every other cycle or period of the clock.

Figure 6:
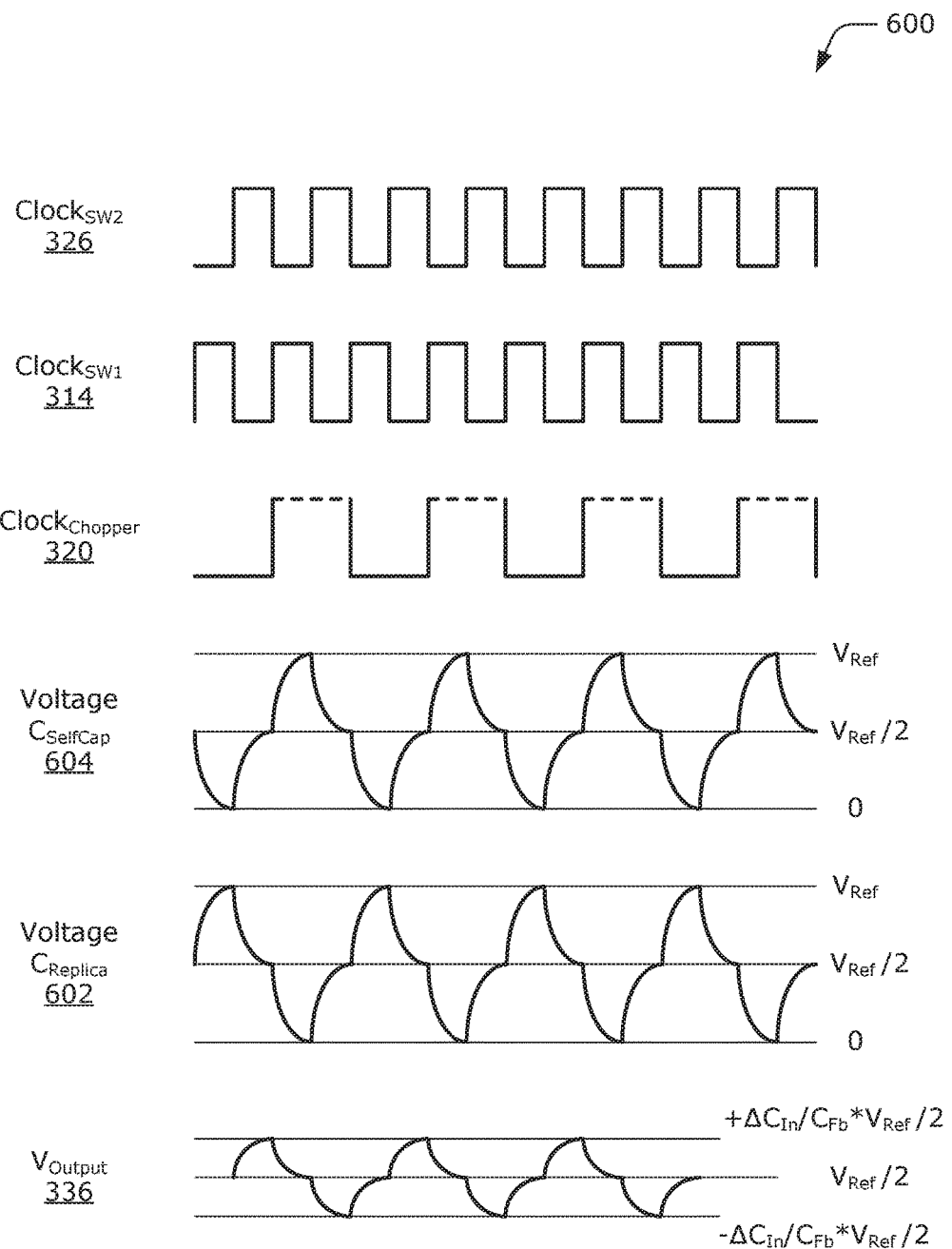
FIG. 6 illustrates example signals that have been modulated and amplified in accordance with one or more aspects.

By way of example, consider the sensing capacitor 122 and replica capacitor 304 of the C2V modulation circuit 124. With reference to the clock and voltage waveforms shown at 600 of FIG. 6, during a first period of the first switch clock 314, the switch 306 connects the replica capacitor 304 to the reference voltage source 316. This causes a voltage 604 of the replica capacitor 304 to increase during the first period of the first switch clock 314.

At 504, the method includes connecting a second capacitor to ground or a ground rail. The second capacitor may be a replica capacitor or a sensing capacitor connected to an input of a touch sense circuit. In some cases, the second capacitor is connected to ground based on a clock. In such cases, the second capacitor can be connected to ground during every other cycle or period of the clock.

In the context of the present example, during the first period of the first switch clock 314, the switch 308 connects the input 302 of the C2V modulation circuit 124 to ground 318. This is effective to discharge a voltage 604 of the self-capacitance 204 and the sensing capacitor 122 during the first period of the first switch clock 314.

At 506, the method comprises connecting the first capacitor to the second capacitor to charge share respective voltages of the capacitors. Prior to connecting the first and second capacitor, the method may also include disconnecting the first capacitor from the voltage source or the second capacitor from ground. In some cases, a first clock controls the disconnection of the first and second capacitor from the voltage source and ground, respectively. In such cases, a second clock can control the connection of the first capacitor to the second capacitor to implement charge sharing. The first and second clock may vary in phase by approximately 180 degrees such that the capacitors are disconnected from the reference voltage and ground during the charge share operations. Alternately or additionally, one of the clocks may be implemented by inverting the other clock, such that operation of both clocks can be controlled by varying one of the clocks.

When the first and second capacitors are oppositely charged prior to charge sharing, a result of the charge share may approach one half of the reference voltage to which one of the capacitors is charged. Alternately or additionally, the replica capacitor may be adjusted or calibrated to have a capacitance approximate that of the self-capacitance 204. By so doing, the C2V modulation circuit can compensate for drift of the self-capacitance 204 over time or temperature.

Continuing the ongoing example, the switches 306 and 308 open during the low portion of the first period of the first switch clock 314. This disconnects the replica capacitor 304 from the reference voltage 316 and the sensing capacitor 122 from ground 318. As shown at 600, the second switch clock 326 is out of phase from the first switch clock 314 by 180 degrees, such that the switches 322 and 324 connect the replica capacitor 304 and the sensing capacitor 122 when the capacitors are disconnected from the reference voltage source and ground.

Optionally at 508, the method includes amplifying a shared charge of the first and second capacitors. The amplifier receiving the shared charge of the capacitors may be referenced to a fraction of the reference voltage, such as one half of the reference voltage. By so doing, the amplifier can compensate for an offset of the reference voltage, providing an offset-free output signal.

Concluding the present example, the amplifier 328 of the C2V modulation circuit 300 amplifies the result of the charge sharing between the replica capacitor 304 and the sensing capacitor 122, which also includes self-capacitance 204. Here, assume that the replica capacitor 304 has been adjusted or calibrated to approximate the self-capacitance 204 of the fingerprint scanner. By compensating for reference voltage offset and the self-capacitance 204, the amplifier 328 provides an output signal 336 indicating a change in the input capacitance 206 divided by the feedback capacitor 332 of the amplifier 328.

Optionally at 510, the method includes sampling a shared charge of the first and second capacitors. The shared charge can be sampled by an analog-to-digital converter or an analog-to-digital input of a microcontroller or DSP. In some cases, the ADC or sampling component receives an indication of the reference voltage source 316, which may enable the ADC or subsequent digital processing component to compensate for an offset of the reference voltage 316. Similar to the output signal 336 of the amplifier, the ADC or sampling component can provide a digital signal indicating a change of the input capacitance 206 that is compensated for the self-capacitance 204 or an offset of the reference voltage 316.

From operation 508 or operation 510, the method 500 may return to operation 502 to implement another charge and discharge cycle of the sensing capacitor 122 and replica capacitor 304. In some cases, the charge and discharge cycles are alternated based on the chopper clock 320 to modulate the respective capacitances of the sensing capacitor 122 and replica capacitor 304. By so doing, low frequency noise, such as the reference voltage offset, temperature drift, and pink noise may be removed from the output of the amplifier 328 or ADC 338. The output signal 336 of the amplifier or output of the ADC can then be demodulated and filtered via a low-pass filter to remove higher frequency noise. The resulting signal can be compared to a threshold to detect touch input at the sensing capacitor 122.

Figure 7:
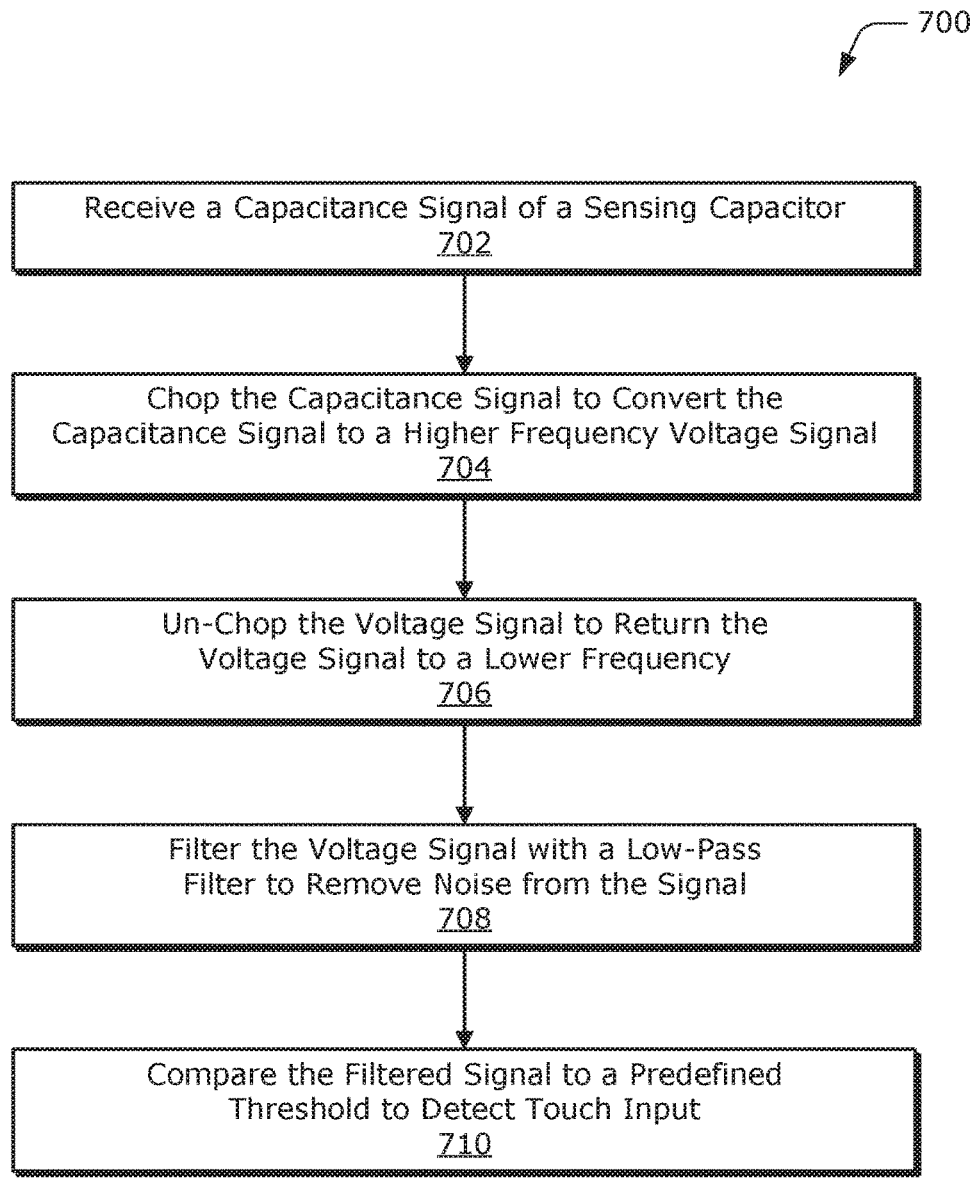
FIG. 7 illustrates an example method for chopping a touch input signal to enable detection of touch input.

FIG. 7 illustrates an example method 700 for chopping a touch input signal to enable detection of touch input. The operations described herein may be performed using any suitable circuitry or component, such as the C2V modulation circuit 124, ADC 338, demodulation block 344, or low-pass filter 346.

At 702, the method comprises receiving a capacitance signal of a sensing capacitor. The capacitance signal may be low frequency or near-DC, such as 10 Hz or less. By way of example, consider FIG. 8, which illustrates example signal processing operations and signals in both time and frequency domains. A capacitance signal 802 is received that has a frequency spectrum of approximately 5 Hz.

At 704, the method includes chopping the capacitance signal to convert the capacitance signal to a higher frequency voltage signal. The capacitance signal may be chopped or modulated at any suitable frequency, such as 50 KHz to 250 KHz. In some cases, the signal is chopped via a square wave by switching the sensing capacitor between ground and a reference voltage. By so doing, the use of sinusoidal waveforms can be avoided, thus precluding the need for power hunger digital-to-analog or mixing components. As such, the C2V modulation circuit 124 can be implemented a low-power solution for detecting capacitive touch input.

Figure 9:
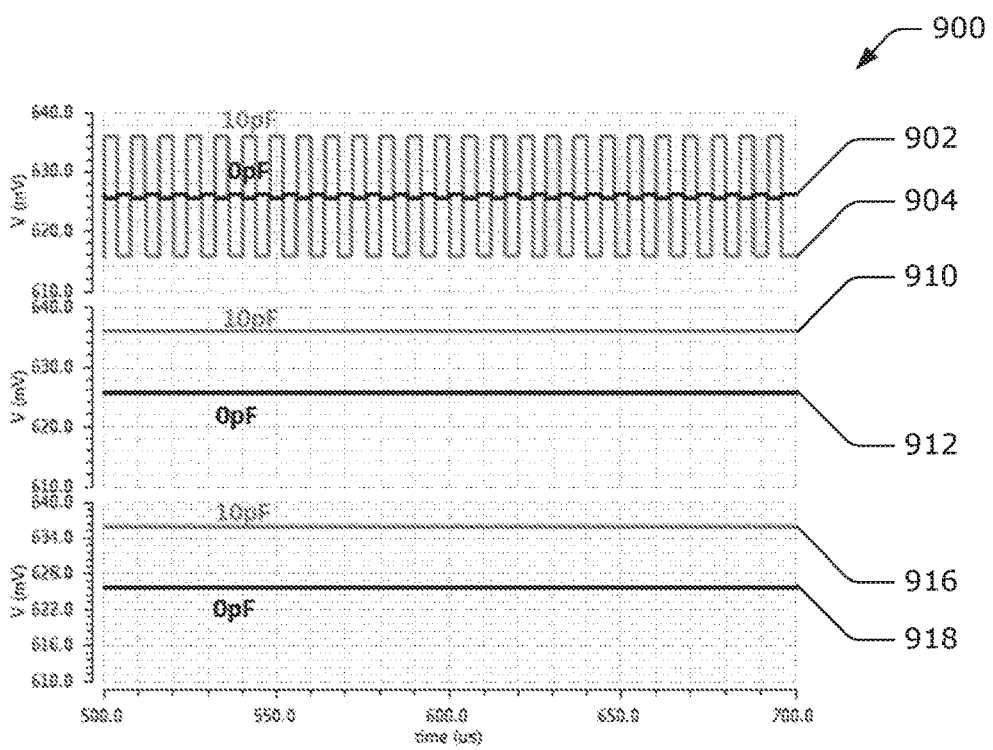
FIG. 9 illustrates example signal waveforms provided by the operations of FIG. 8.
Figure 9:
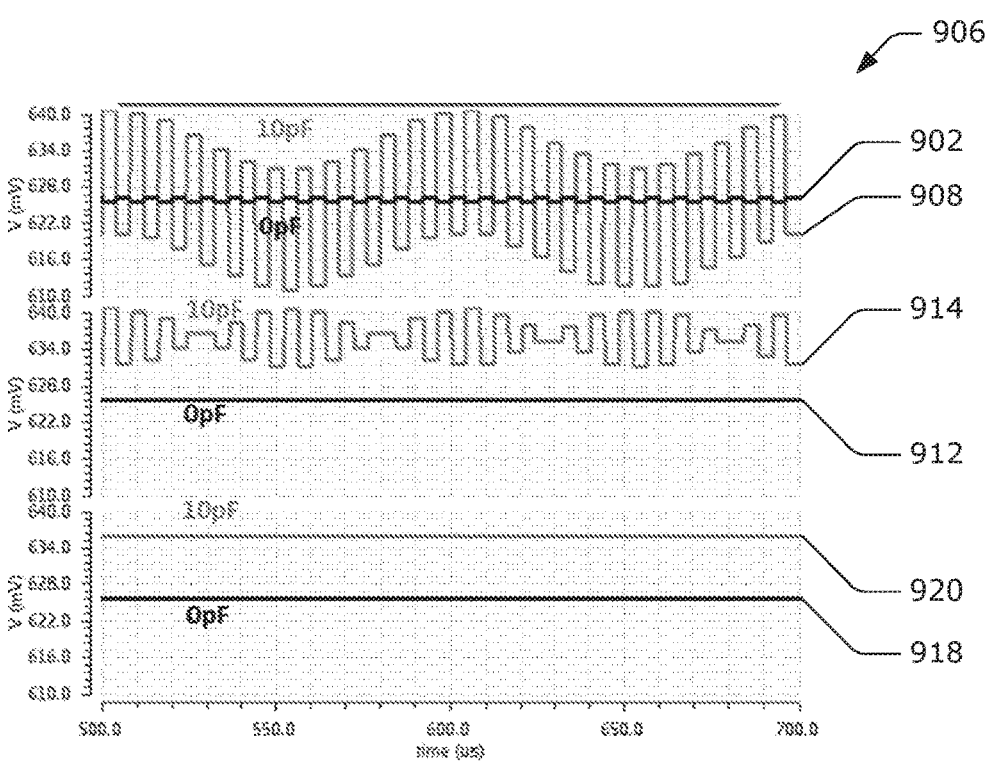

An example chopping operation is shown at 804, which converts the capacitance signal to a higher frequency voltage signal, thereby moving a spectrum of the signal away from DC in the frequency domain. FIG. 9 illustrates additional signals in which touch input is received relative an absence of touch input. Here, a chopped capacitance 902 of zero pF is shown relative a chopped capacitance signal of 10 pF (e.g., a finger press).

Returning to FIG. 8, an example of noise 806 (e.g., single-tone noise) is shown relative the spectrum of the chopped signal. Here, note that an amplitude of the noise 806 is greater than an amplitude of the chopped capacitance signal. Another example of this signal is shown at 906, in which chopped capacitance signal 908 includes noise, such as that caused by a switch-mode power supply or battery charging circuit.

At 706, the method comprises un-chopping the voltage signal to return the signal to a lower frequency. In some cases, un-chopping the voltage signal may include charge sharing, amplification, or analog-to-digital conversion operations. For example, the C2V modulation circuit 124 may implement the chopping and un-chopping operation to return a signal to the lower frequency. In at least some aspects, the un-chopping or demodulation of the voltage signal is performed based on the frequency at which the signal was chopped or modulated. By so doing, low-frequency and other noise can be removed or suppressed after the signal is un-chopped.

Figure 8:
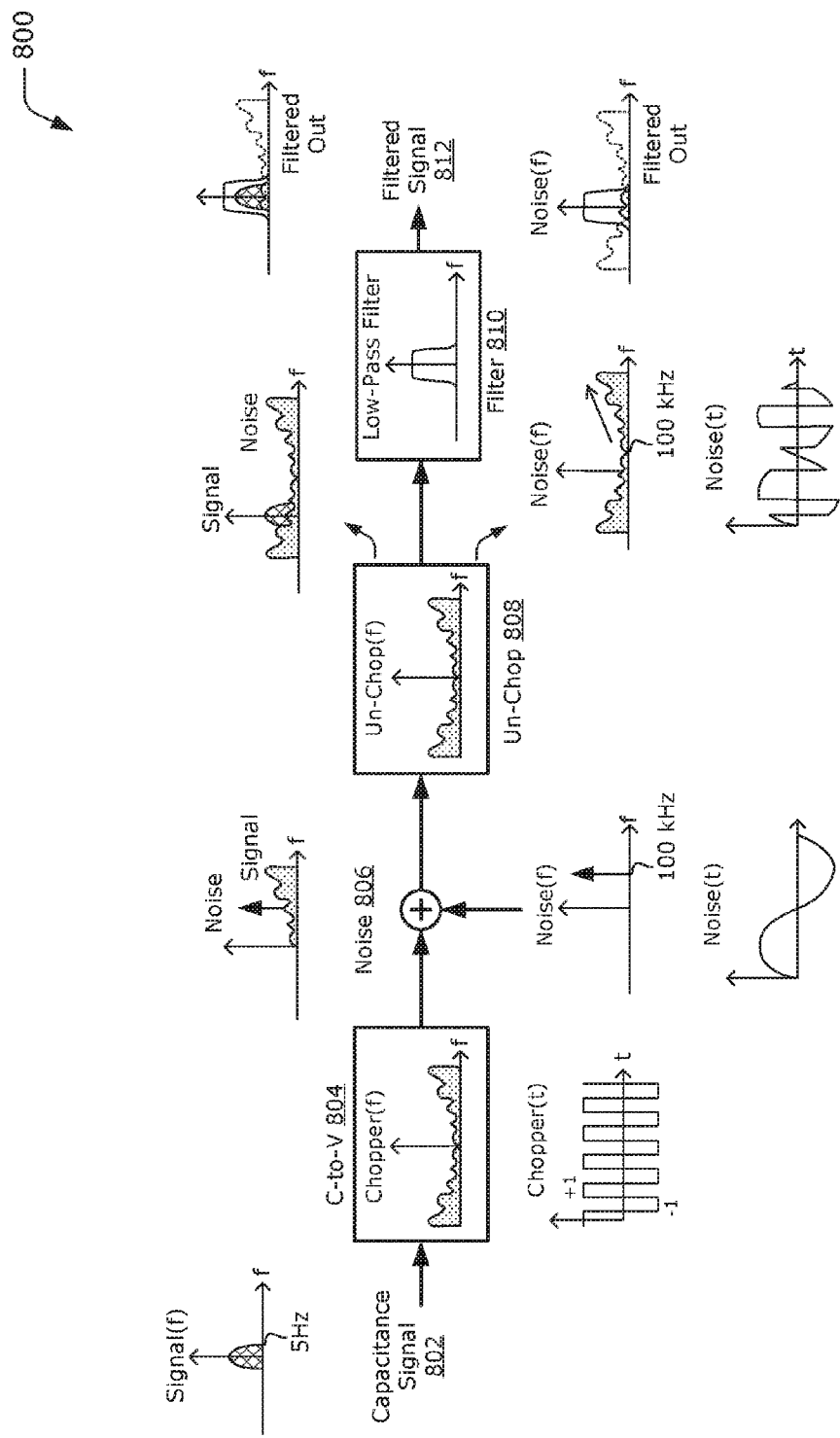
FIG. 8 illustrates example processing operations that include chopping, un-chopping, and filtering of a capacitance signal.

As illustrated in FIG. 8, the un-chop operation 808 returns the capacitance signal to a lower frequency. Here, note that the noise 806 remains spread across higher frequencies of the spectrum. Returning to FIG. 9, an example un-chopped signal 910 associated with touch input is shown relative an un-chopped signal 912 for an absence of touch input. Without noise on the chopped signal 904, the un-chopping provides a clean un-chopped signal 912 for detecting touch input. As shown at 914, when the noisy chopped signal 908 is un-chopped, the noise is present in the un-chopped signal, but at a higher frequency.

At 708, the method includes filtering the voltage signal with a low-pass filter to remove noise from the signal. The low-pass filter may be any suitable low-pass filter or second-order low-pass filter, such as a Butterworth filter, Chebyshev filter, Bessel filter, Sallen-Key filter, and the like. In the context of FIG. 8, a filter operation 810, which implements a low-pass filter (LPF) filters out the noise 806 at the higher frequencies of the spectrum, which provides a low-frequency signal for detecting touch input.

Returning to FIG. 9, a filtered capacitance signal 916 associated with touch input results in a signal approximately 10 mV greater than a filtered capacitance signal 918 indicating the absence of touch input. Similarly, when the noisy un-chopped signal 914 is filtered, a filtered capacitance signal 920 with suppressed noise is approximately 10 mV greater than the baseline filtered capacitance signal 918. Thus, the chopping, un-chopping, and filtering operations can be effective to suppress noise, particularly those different from the chopping frequency.

Figure 10:
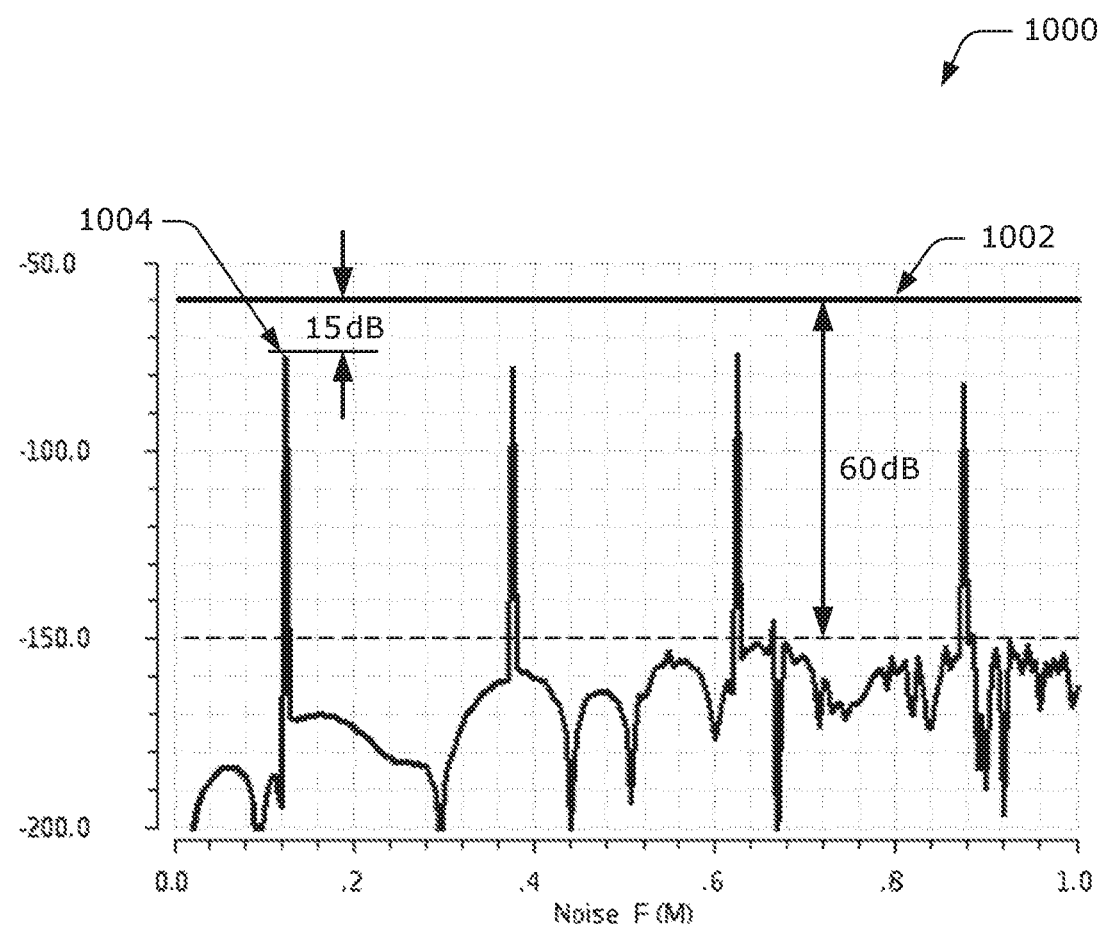
FIG. 10 illustrates an example power spectral density of noise relative to a signal modulated and filtered in accordance with one or more aspects.

By way of example, consider FIG. 10 in which a power spectrum density of noise (e.g., charger noise) is shown at 1000. Here, a touch capacitance signal 1002 has approximately 15 dB of margin above noise peak 1004 at the chopping frequency (e.g., 125 KHz) and harmonics thereof. At other frequencies, however, the C2V modulation signals provides a noise margin of over 60 dB. As such, varying the chopping or modulation frequency may increase a C2V modulation circuit's immunity to noise.

At 710, the method comprises comparing the filtered signal to a predefined threshold to detect touch input. The filtered signal may be compared to the threshold via any suitable logic, such as an analog or digital comparator connected to the output of the filter. When a voltage of the filtered signal exceeds the predefined threshold, the touch input is detected. An indication of the touch input can then be transmitted to other entities, such as a power management pin of the fingerprint scanner or user input application programming interface (API).

In some aspects, the predefined threshold for detecting touch input is calibrated or set based on the capacitance signal when touch input is absent. For example, when a device initiates operation, a controller associated with the touch sense circuit may capture samples of the capacitance signal to determine a baseline voltage indicating the absence of touch input. The predefined threshold can then be set as an offset from, or percentage of, the baseline voltage. Alternately or additionally, the calibration of the predefined threshold may be repeated periodically or at random intervals to account for temperate drift or other DC offsets.

Figure 11:
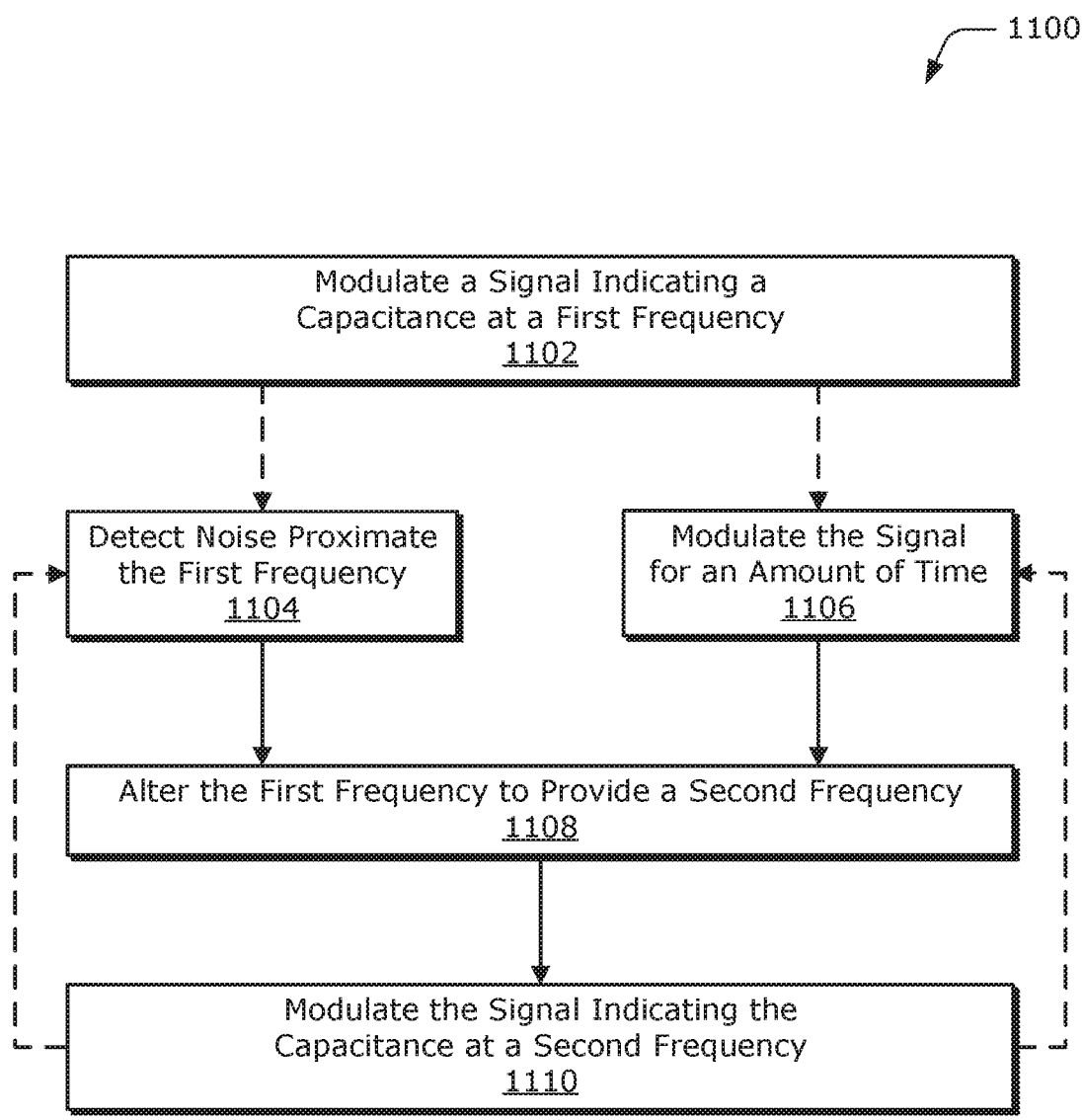
FIG. 11 illustrates an example method for altering a frequency by which a capacitance signal is modulated.

FIG. 11 illustrates an example method 1100 for altering a frequency by which a capacitance signal is modulated. The operations described herein may be performed using any suitable circuitry or component, such as the C2V modulation circuit 124, or a DSP or microcontroller associated therewith.

At 1102, the method comprises modulating a signal indicating a capacitance at a first frequency. The signal may be generated by applying a modulation signal to a sensing capacitor, such as a sensing capacitor connected to an input of a touch sense circuit. In some cases, the modulation is a square wave generated by a chopper circuit that chops the signal at half of a frequency of the square wave. Touch input may be sensed based on a signal provided by demodulating and/or filtering the modulated signal.

Optionally at 1104, the method includes detecting noise proximate the first frequency. The noise may be detecting based on any suitable criteria, such as by calibration or false detection of touch input. In some cases, an indication of a frequency is received from another component of a device, such as a charging circuit or memory controller. Noise may be detected responsive to determining that the frequency at which the other component operates, or a harmonic thereof, is proximate a frequency at which the signal is modulated.

Optionally at 1106, the method comprises modulating the signal for an amount of time. The method may modulate the signal for a predetermined amount of time or a random amount of time. The amount of time may be varied effective to avoid noise at particular frequencies or to distribute a power spectral density of the signal modulation circuit over a wider range of frequencies.

At 1108, the method includes altering the first frequency to provide a second frequency for modulating the capacitance signal. Responsive to detecting noise or after the amount of time, the first frequency is altered to provide a second frequency. The second frequency may be predefined, based on a predefined offset, or randomly determined. For example, the first frequency may be incremented or decremented by a predefined offset to provide the second frequency. Alternately or additionally, pseudorandom frequency hopping may be implemented by randomly varying the first frequency or selecting a random frequency for the second frequency.

At 1110, the method comprises modulating the signal indicating the capacitance at the second frequency. This may include altering a clock signal by which the signal is modulated. For example, a programmable clock generator, such as a delay-lock loop (DLL) or phase-lock loop (PLL), can be set or configured to provide a clock signal at the second frequency. By modulating the capacitance signal at different frequencies, noise can be avoided thereby improving an accuracy of a touch sense circuit.

From operation 1110, the method may return to operation 1104 or to operation 1106. Thus, the method may repeatedly or continuously alter or change frequencies at which the capacitance signal is modulated. By so doing, frequency hopping can be implemented to improve noise resistance of the touch sense circuit. Alternately or additionally, noise generated by the modulation circuit, such as a C2V modulation circuit, can be distributed or spread over a wider range of frequencies.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A circuit for modulating a signal, the circuit comprising:
    a first pair of switches that includes one switch connected in series between a voltage source and a capacitor, and another switch connected in series between ground and an input of the circuit;
    a second pair of switches that includes one switch connected in series between the voltage source and the input of the circuit, and another switch connected in series between ground and the capacitor; and
    a third pair of switches that includes one switch connected in series between the capacitor and a circuit node, and another switch connected in series between the input of the circuit and the circuit node, the circuit node connected to an input of an analog-to-digital converter (ADC).

2. The circuit as recited in claim 1, wherein the input of the ADC is a first input, the ADC includes at least the first input and a second input, and the second input is connected to the voltage source.

3. The circuit as recited in claim 1, wherein the input of the ADC is a first input, the ADC includes at least the first input and a second input, and the second input is connected to another voltage source having a voltage that is a fraction of a voltage of the voltage source.

4. The circuit as recited in claim 3, wherein the voltage of the other voltage source is approximately half of the voltage of the voltage source.

5. The circuit as recited in claim 1, wherein the input of the circuit is connected to another capacitor, and the other capacitor has a capacitance that is approximately equal to a capacitance of the capacitor.

6. The circuit as recited in claim 1, wherein the first pair of switches are configured to close during a first period of a clock, and the second pair of switches are configured to close during a second period of the clock, the first and second periods being different periods of the clock.

7. The circuit as recited in claim 6, wherein the third pair of switches are configured to close during at least two consecutive periods of the clock.

8. The circuit as recited in claim 1, wherein respective gates of the first pair of switches are connected together, respective gates of the second pair of switches are connected together, or respective gates of the third pair of switches are connected together.

9. The circuit as recited in claim 1, wherein the signal is configured to indicate an amount of capacitance at the input of the circuit.

10. The circuit as recited in claim 1, wherein the ADC is operably connected to a demodulator, and the demodulator is connected to a second-order low-pass filter.

11. The circuit as recited in claim 10, wherein the second-order low-pass filter comprises one of a Butterworth filter, Chebyshev filter, Bessel filter, or Sallen-Key filter.

12. The circuit as recited in claim 1, wherein the capacitor is unswitchably coupled to ground.

13. A circuit for modulating a signal, the circuit comprising:
    a first pair of switches that includes one switch connected in series between a voltage source and a capacitor, and another switch connected in series between ground and an input of the circuit;
    a second pair of switches that includes one switch connected in series between the voltage source and the input of the circuit, and another switch connected in series between ground and the capacitor; and
    a third pair of switches that includes one switch connected in series between the capacitor and a circuit node, and another switch connected in series between the input of the circuit and the circuit node, the circuit node connected to an input of an amplifier.

14. The circuit as recited in claim 13, wherein the input of the amplifier is a first input of the amplifier, the amplifier includes the first input and a second input, and the second input of the amplifier is connected to another voltage source having a voltage that is approximately half of a voltage of the voltage source.

15. The circuit as recited in claim 13, wherein the capacitor is a first capacitor, and the circuit further comprises a second capacitor connected between the input of the amplifier and an output of the amplifier.

16. The circuit as recited in claim 15, further comprising an additional switch connected between the input of the amplifier and the output of the amplifier.

17. The circuit as recited in claim 16, wherein the third pair of switches are configured to close based on a first clock, the additional switch is configured to close based on a second clock, and a phase of the first clock is different from a phase of the second clock by approximately 180 degrees.

18. The circuit as recited in claim 13, wherein the first pair of switches or the second pair of switches are configured to close based on a first clock, the third pair of switches are configured to close based on a second clock, and a phase of the first clock is different from a phase of the second clock by approximately 180 degrees.

19. The circuit as recited in claim 13, wherein an output of the amplifier is connected to an input of an analog-to-digital converter (ADC).

20. The circuit as recited in claim 19, wherein an output of the ADC is connected to an input of a demodulator, and an output of the demodulator is connected to a second-order low-pass filter.

21. The circuit as recited in claim 13, wherein gates of the first pair of switches are connected together, gates of the second pair of switches are connected together, and gates of the third pair of switches are connected together.

22. The circuit as recited in claim 13, wherein connections between respective switches of the pairs of switches and the voltage source, ground, and the circuit node comprise direct connections without intervening components.

23. The circuit as recited in claim 13, wherein the circuit is included in an apparatus configured to scan fingerprints.

24. A circuit for modulating an indication of capacitance at an input of the circuit, the circuit comprising:
- first switching means for connecting a voltage source to a capacitor, and the input of the circuit to ground;
- second switching means for connecting the voltage source to the input of the circuit, and the capacitor to ground;
- third switching means for connecting the capacitor to a circuit node, and the input of the circuit to the circuit node, the circuit node connected to an input of an analog-to-digital converter (ADC); and
- means for sharing charge between the capacitor and another capacitor that becomes coupled to the input of the circuit.

25. The circuit as recited in claim 24, wherein the first switching means is configured to be active during a period of a clock, and the second switching means is configured to be active during another period of the clock during which the first switching means is not active.

26. The circuit as recited in claim 24, further comprising:
- demodulation means for demodulating a signal provided by the ADC to produce a demodulated signal, the demodulation means connected to an output of the ADC; and
- filter means for filtering the demodulated signal provided by the demodulation means, the filter means connected to an output of the demodulation means.

27. A circuit for modulating a signal, the circuit comprising:
- a first pair of switches that includes one switch connected between a voltage source and a capacitor, and another switch connected between ground and an input of the circuit;
- a second pair of switches that includes one switch connected between the voltage source and the input of the circuit, and another switch connected between ground and the capacitor;
- a sampling component having an input and an output;
- a third pair of switches that includes one switch connected between the capacitor and the input of the sampling component, and another switch connected between the input of the circuit and the input of the sampling component; and
- a demodulator connected to the output of the sampling component.

28. The circuit as recited in claim 27, wherein the input of the sampling component comprises an input of a separate analog-to-digital converter (ADC), an analog-to-digital input of a microcontroller, or an analog-to-digital input of a digital signal processor (DSP).

29. The circuit as recited in claim 27, further comprising:
- a circuit node connected to the input of the sampling component and to the capacitor via the one switch of the third pair of switches, the circuit node configured to be connected to another capacitor via the other switch of the third pair of switches.

30. The circuit as recited in claim 27, further comprising:
- a filter connected to an output of the demodulator.

* * * * *